United States Patent
Dhuyvetter (10) Patent No.: US 9,154,101 B2
(45) Date of Patent: Oct. 6, 2015

(54) ACTIVE AUDIO TRANSDUCER PROTECTION

(75) Inventor: Timothy Alan Dhuyvetter, Arnold, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 379 days.

(21) Appl. No.: 13/530,757

(22) Filed: Jun. 22, 2012

(65) Prior Publication Data

US 2013/0022208 A1    Jan. 24, 2013

Related U.S. Application Data

(60) Provisional application No. 61/500,880, filed on Jun. 24, 2011.

(51) Int. Cl.
    *H03G 11/00*      (2006.01)
    *H03G 7/00*      (2006.01)

(52) U.S. Cl.
    CPC ............. *H03G 7/002* (2013.01); *H03G 11/002* (2013.01)

(58) Field of Classification Search
    CPC ........ H04R 3/007; H04R 3/00; H04R 29/001; H04R 29/003; H04R 29/004; H04R 3/002; H03F 1/52; H03F 2200/331; H03F 1/30; H03F 2200/03; H03G 11/00; H03G 11/008; H03G 11/02; H03G 11/04; H04S 7/301; H04S 3/00
    USPC ............ 381/55, 58, 164, 94.9, 94.8, 94.1, 28, 381/61, 119, 120, 121, 103, 102, 101, 100, 381/99, 93, 83, 71.14, 71.12, 71.11, 71.1, 381/317, 318, 320, 111, 116, 117; 700/94
See application file for complete search history.

(56) References Cited

U.S. PATENT DOCUMENTS

| | | | |
|---|---|---|---|
| 5,729,611 A * | 3/1998 | Bonneville | 381/55 |
| 2004/0178852 A1* | 9/2004 | Neunaber | 330/284 |
| 2009/0046872 A1* | 2/2009 | Vollmer | 381/102 |
| 2011/0182434 A1* | 7/2011 | Martz et al. | 381/55 |

FOREIGN PATENT DOCUMENTS

| | | |
|---|---|---|
| CN | 1741685 A | 3/2006 |
| CN | 101044786 A | 9/2007 |
| CN | 202841483 U | 3/2013 |
| KR | 102013000116 A | 1/2013 |

OTHER PUBLICATIONS

"Chinese Application Serial No. 20120210343.1, Office Action mailed Nov. 3, 2014", 9 pgs.

(Continued)

*Primary Examiner* — Leshui Zhang
(74) *Attorney, Agent, or Firm* — Schwegman Lundberg & Woessner, P.A.

(57) ABSTRACT

This document discusses, among other things, apparatus and methods for providing audio transducer protection. In an example, an audio protection circuit can include a first comparator configured to compare peak power information of a drive signal of an amplifier of an audio system with a first threshold, a limiter circuit configured to limit an input of the amplifier if the peak power information of the drive signal exceeds the first threshold, and a second comparator configured to compare average power information of the drive signal with a second threshold and to provide an output signal configured to modulate a gain of a pre-amplifier of the audio system using the comparison.

20 Claims, 5 Drawing Sheets

(56) References Cited

OTHER PUBLICATIONS

"Chinese Application Serial No. 201210210343.1, Office Action mailed Aug. 27, 2012", 2 pgs.

"Chinese Application Serial No. 201210210343.1, Response filed Oct. 24, 2012 to Office Action mailed Aug. 24, 2012", 21 pgs.

"Chinese Application Serial No. 201220298184.0, Office Action mailed Oct. 24, 2012", 2 pgs.

"Chinese Application Serial No. 201220298184.0, Response filed Nov. 9, 2012 to Office Action mailed Oct. 24, 2012", 23 pgs.

\* cited by examiner

ACTIVE AUDIO TRANSDUCER PROTECTION

CLAIM OF PRIORITY AND RELATED APPLICATIONS

This patent application claims the benefit of priority, under 35 U.S.C. Section 119(e), to Dhuyvetter, U.S. Provisional Patent Application Ser. No. 61/500,880, entitled "ACTIVE AUDIO TRANSDUCER PROTECTION," filed on Jun. 24, 2011, which is hereby incorporated by reference herein in its entirety.

BACKGROUND

Mobile electronics have made it increasingly more convenient for users to be in touch with the world as events unfold as well as to enjoy various forms of entertainment. As mobile electronics have matured, market pressure has led to smaller, higher performing systems. Accordingly, audio output transducers for mobile devices have become very small and can provide robust sound quality. However, such components can be easily damaged under what have become "normal" operating conditions.

OVERVIEW

This document discusses, among other things, apparatus and methods for providing active audio transducer protection. In an example, an audio protection circuit can include a first comparator configured to compare peak power information of a drive signal of an amplifier of an audio system with a first threshold, a limiter circuit configured to limit an input of the amplifier if the peak power information of the drive signal exceeds the first threshold, and a second comparator configured to compare average power information of the drive signal with a second threshold and to provide an output signal configured to modulate a gain of a pre-amplifier of the audio system using the comparison.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, a method to measure and control both average and peak power of an amplifier output into a load. Measuring and controlling average and peak power of an amplifier output can limit potentially harmful levels of either peak or average power that might damage the load, such as an audio transducer including speakers. A damaged audio speaker, such as those used with cell phones, personal digital assistants, portable or pad computers, or personal media players, for example, can severely distort an acoustic output or limit the ability of the transducer to provide an acoustic output at all.

There is an increasing demand in today's mobile electronic devices (such as cell phones and other portable audio devices) for louder audio output, both for music and speech. Providing and broadcasting louder audio output can result in electrical stress placed on the small audio transducers, such as small speakers, embedded in these devices. The added stress can surpass the physical and electrical limits of the transducers. Many of today's high performance speaker amplifiers employed in mobile audio products can produce peak output power in excess of 4 W. At the same time, due to the small dimensions of the speakers in these applications, the power rating of these speakers is often much lower, commonly no more than 0.5 W. Typically, speaker efficiency (e.g., electrical power input, W, to acoustic power output, dBSPL) and power rating decrease proportionally with speaker size. Consequently, as input power increses to achieve higher acoustic output, an opportunity for active speaker protection exists to prevent speakers from being permanently damaged Increased use of mobile electronics, including cell phones, smart phones and personal media players has been accompanied by field returns of such devices due to speaker damage or failure. This trend is expected to continue as demand for louder acoustic output increases while speaker transducers remain small and under-rated. Damage to audio speakers can be caused by a variety of electrical overstresses. Speaker impairment can also be caused by physical overstress, for example, dropping a portable device onto a hard surface, harming the speaker diaphragm and causing distortion of the voice coil gap spacing.

Speaker damage can result from excessive heat at the speaker. Heat can build up in an audio speaker as a result of large average power delivered to the speaker. Heat can cause physical damages to the speaker materials as a result of large power dissipation in a small volume. Some examples of excess heat damage can include, but are not limited to, speaker diaphragm warpage and insulation breakdown in the voice coil that can lead to eventual fusing of the voice coil winding. Excessive heat can also de-magnetize the speaker magnet, reducing output efficiency.

Audio signals, such as audio signals including music and speech, can be composed of waveforms that have large crest factors. Crest factor can be defined as the ratio of peak to average signal levels. Audio signals with large crest factors have loud peak signals but lower average power. Symphony music can be an example of an audio signal with a large crest factor, often exhibiting a crest factor of about 12 dB or more. An example of music that can have a low crest factor is highly compressed rock music, often exhibiting a crest factor of about 3 dB.

Driving a speaker with low crest factor audio signals can pose greater risks of causing damage to a speaker from overheating because of the higher continuous (or average) power applied to the speaker when reproducing the audio sounds. High crest factor audio signals enable lower power rated speakers to be driven from higher power audio amplifiers. In an example, active speaker protection can monitor average power delivered to the speaker load and can limit the average power to the speaker to prevent audio transducer damage.

Damage to audio speakers can also be caused by excessive peak power signals. Speaker damage is often cumulative, such that excessive power driven into speakers can, over time, degrade speaker effectiveness and result in poorer acoustic performance. Speaker damage due to excessive peak power tends to be permanent. Peak power signals that occur in short bursts with small duty cycles do not cause heat to build up within the speaker, so average power effects are typically not an issue. However, peak signals can still cause damage to speaker components. For example, a peak power signal can cause the voice coil winding of a speaker to fuse similar to average power heating effects but where the power level is much higher. Peak power signals can also force speaker diaphragm and voice coil excursions to exceed their physical limits. Such excursion can cause permanent speaker damage. Damage due to peak power signals can be reduced or eliminated by limiting peak power signals that are delivered to the speaker. Signal limiting or clamping can be used, but this can cause distortion of peak signals even when the possibility of speaker damage is remote. Soft clipping using dynamic range control (e.g., compression) can significantly reduce harsh distortion. Peak signals generally are comprised of audio tones with short pulse width duration and a fast rise time. Therefore, speaker protection schemes having a fast response time to limit peak power rapidly can provide good protection while limiting distortion to those times when damage is most likely to occur.

Figure 1:
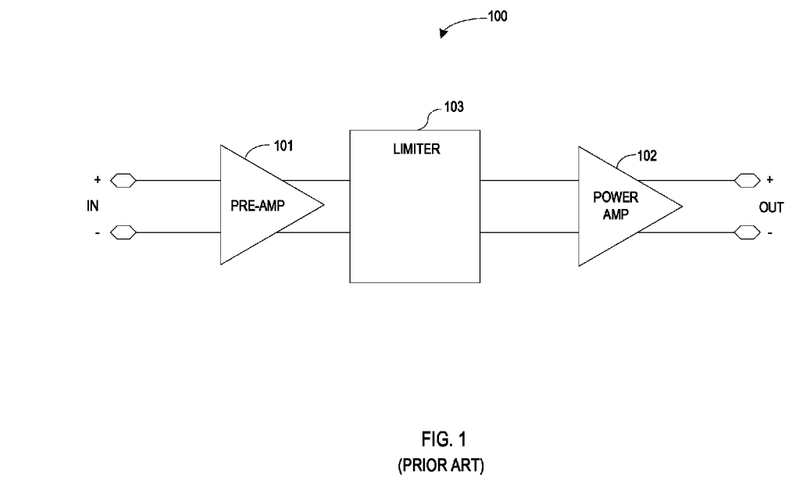
FIG. 1 illustrates generally an example of a speaker protection circuit.

A basic method of speaker protection can use voltage limiting of the speaker amplifier output as shown in FIG. 1. The audio system 100 of FIG. 1 includes a speaker amplifier including a pre-amplifier 101, a power amplifier 102, and a limiter 103. If a given speaker load impedance is known, then, from the equation, $$P=V^2/R,$$

where P is power, V is volts, and R is resistance or impedance, the output power can be limited by limiting the voltage swing. However, manufacturing tolerances can allow significant speaker impedance variation, even for speakers that are of similar size. Temperature, enclosure dimensions, aging and other factors can cause speaker impedance variations. Such variation in impedance can result in unreliable protection unless the impedance value is monitored and the protection scheme is update with an accurate measure of the speaker impedance. Thus, open loop limiting of the voltage swing as a method of protection can lead to clipping of the audio signal and subsequent signal distortion even when the possibility of damage is remote. Voltage limiting methods may not account for excessive average power if the limiting level is set at the peak power level resulting in opportunity for damage due to excessive average power operation.

Improved speaker protection can be realized when the amplifier output power information is measured and the power information is used to limit or control an output power level of the amplifier. In an example, a speaker protection scheme can maximize output peak and average power of an audio signal delivered to a speaker without distorting or degrading the audio signal unless continued delivery could risk speaker damage. Where speaker damage can result from continued delivery of the audio signal at the desired peak or average power level, the signal can be modified to an extent that peak and average power are maximized without a substantial risk of speaker damage. Since excess power delivered to a speaker can be a cause of speaker damage, controlling the power delivered to the speaker can result in improved speaker protection.

Figure 2:
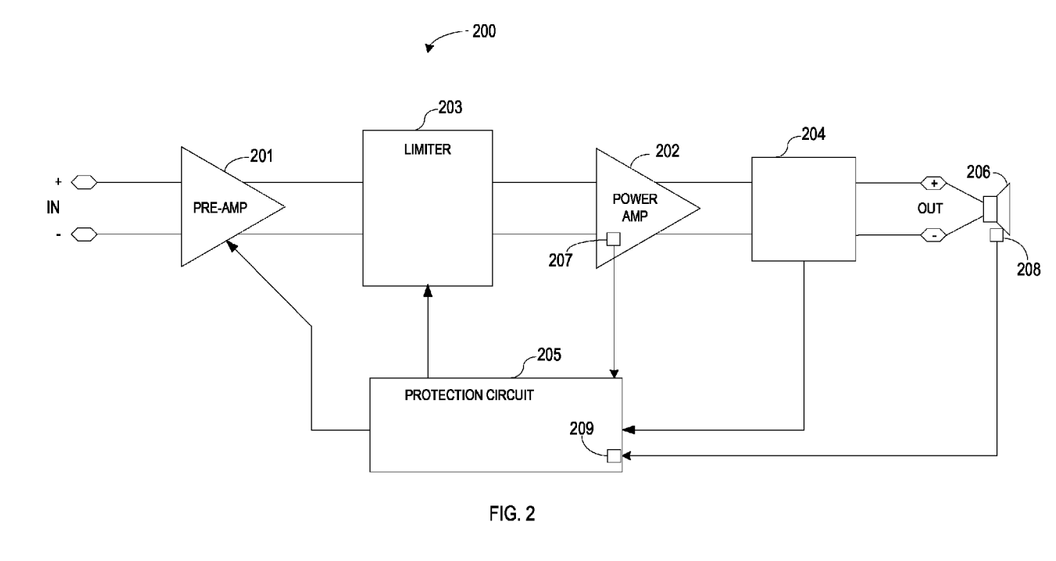
FIG. 2 illustrates generally an example of an active speaker protection circuit.

FIG. 2 illustrates generally an example of an active speaker protection scheme in an audio system 200 including a pre-amplifier 201, a power amplifier 202, a limiter 203, a power monitoring circuit 204, and a protection circuit 205. In certain examples, the output signal (OUT) can drive a speaker 206 and the current that flows into the speaker 206 can be measured separately using the power monitoring circuit 204. In an example, the measured signals can be multiplied to generate output power information representative of the actual output power, and the output power information can be processed in a number of ways.

In the example of FIG. 2, the output power information can be used to directly control the limiter 203, or compression system, for real-time dynamic range control. The output power information can also be integrated to create an average value of the speaker load power that can be used to modulate the gain of the signal path, such as the gain of the pre-amplifier 201, or adjust some other signal control. Often, but not always, most of the power in an audio signal is at low frequencies. In certain examples, the output power information can be used to reduce low frequency signal content thru a variable high pass filter. Monitoring and modulating output power can reduce speaker protection variation from speaker manufacturing tolerances, such as impedance, and other vendor differences. Load power can change in proportion to load impedance, and therefore, an active protection scheme using output power information can provide a more accurate power limiting algorithm.

In certain examples, a speaker protection scheme might also take into account other physical parameters. Temperature information can be used to modify output power, for example, by modulating the gain of the pre-amplifier 201 in response to temperature changes. Temperature information can include one or more of ambient temperature and temperature information at or near speaker components. In certain examples, one or more temperature sensors 207 can provide temperature information to the protection circuit. In some examples, speaker amplifiers can have internal temperature sensing to limit or control maximum die temperature. Efficiency losses in the speaker amplifier can result in large differences between ambient and junction temperature. However, ambient temperature sensing, even near a speaker amplifier, may not provide particularly good estimates of speaker component temperature. In certain examples, accurate speaker temperature information can be provided using one or more temperature sensors 207 mounted on the speaker 206 or speaker amplifier, such as the pre-amplifier 201 or the power amplifier 202.

Another aspect to speaker protection that can be prominent with portable audio products is physically blocking the speaker port of a speaker 206. Audio speakers used in mobile electronics can be very small and can be mounted in enclosures having a small enclosure volume. It can be easy for a user to completely cover the speaker port with a finger or thumb. When the speaker port is covered, very little of the acoustic energy can be coupled to free air, thus the acoustic energy can be reflected back into the speaker. The captured acoustic energy can dissipate in the speaker voice coil and can rapidly degrade the operation of the speaker. A motion sensor 208 can provide motion information of the speaker diaphragm and can be used to sense speaker port blockage. The protection circuit 205 can receive motion information from the motion sensor 208 at a motion error detector 209 and can modulate the output power to reduce or eliminate speaker damage. In certain examples, the gain of the pre-amplifier 201 can be modulated in response to motion information received at the protection circuit 205 from the motion sensor 208. In an example, limits of the limiter 203 can be modulated in response to motion information received at the protection circuit 205 from the motion sensor 208 to decrease or eliminate opportunities for speaker component damage when a speaker port is blocked.

Figure 3A:
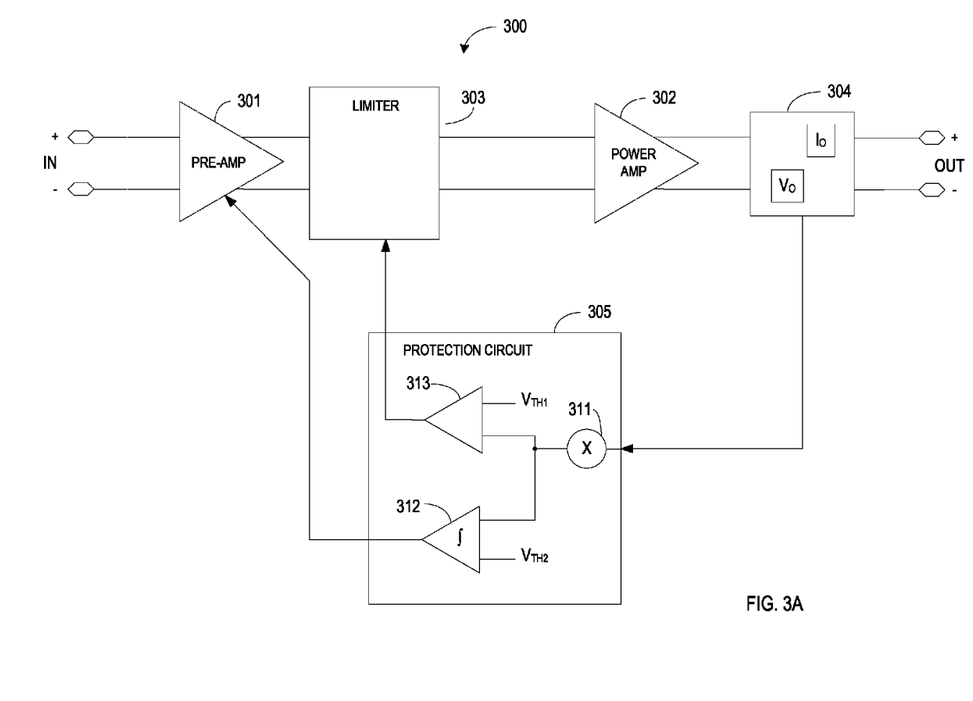
FIGS. 3A-3C illustrate generally examples of an active speaker protection circuit.
Figure 3B:
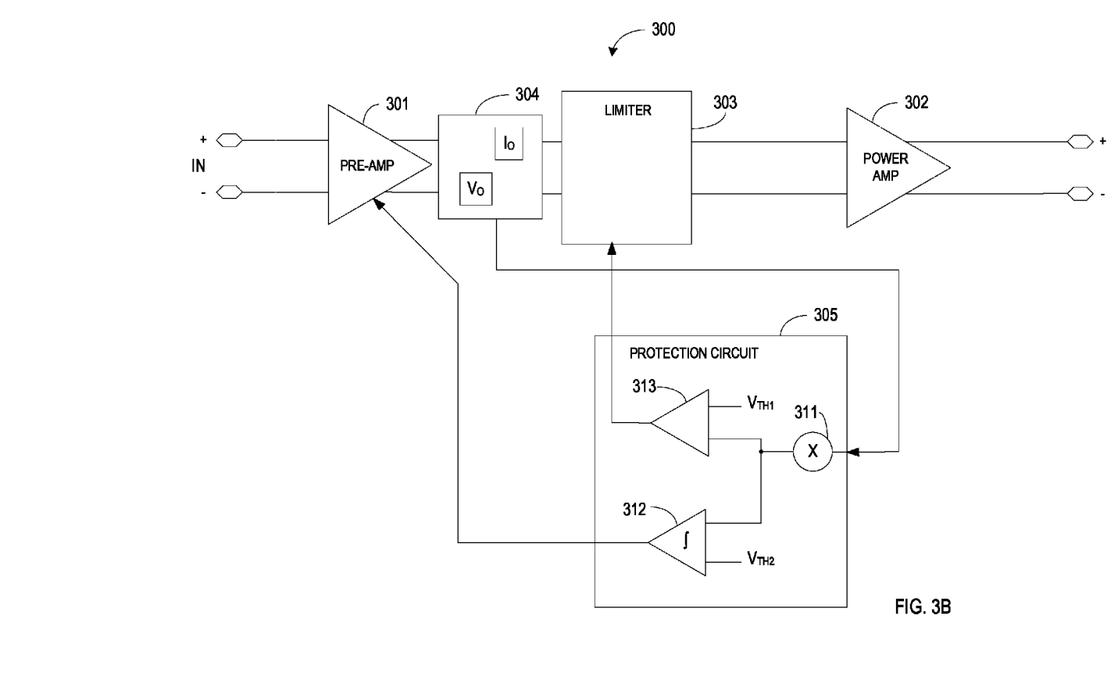
Figure 3C:
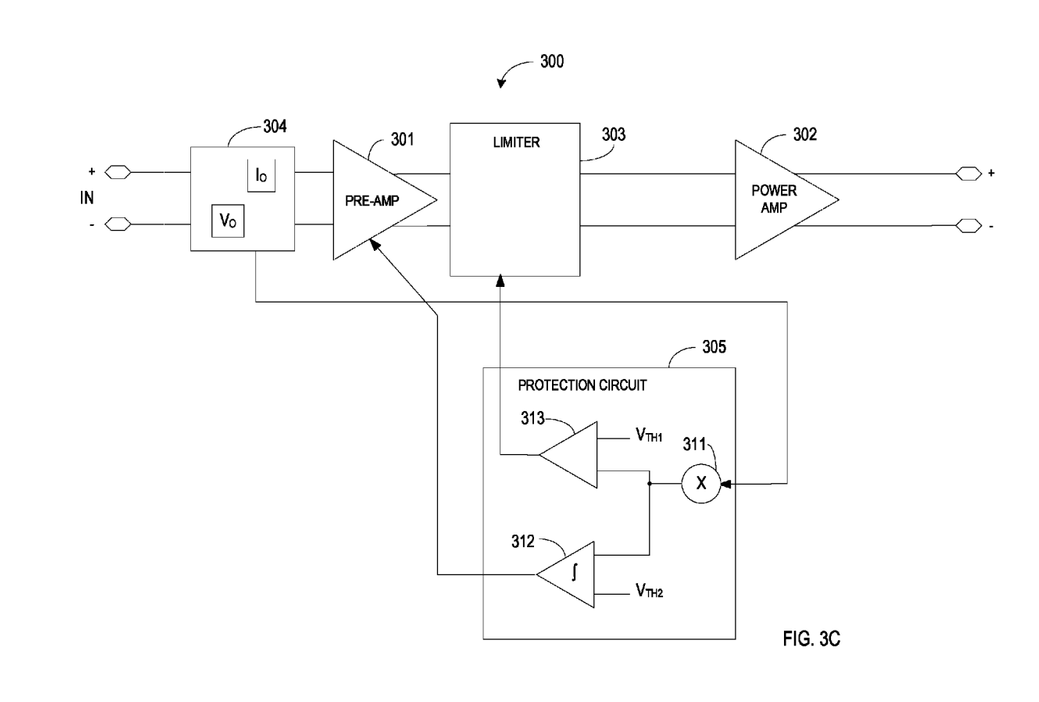

FIG. 3A illustrates generally an audio system 300 including an example active speaker protection system. In an example, the audio system 300 can include a pre-amplifier 301 and a power amplifier 302. In certain examples, the pre-amplifier 301 can receive an input audio signal (IN) and can provide a processed, or amplified, audio signal to the power amplifier 302. The power amplifier 302 can receive the processed audio signal and can amplify the signal to provide an output signal (OUT) to drive an output audio transducer such as a speaker. In certain examples, the speaker protection system can include a power monitoring circuit 304 and a protection circuit 305. In certain examples, the power monitoring circuit 304 can include sensors ($I_O$, $V_O$) to measure output voltage swing and output current provided to a speaker from the power amplifier 302. In certain examples, the power monitoring circuit 304 can provide power information, such as the measured output voltage swing and the measured output current to the protection circuit 305. In some examples, the power monitoring circuit 304 can estimate output power information using the processed audio signal (FIG. 3B) or the input audio signal (FIG. 3C).

In certain examples, the protection circuit 305 can receive power information, such as output current and voltage information, can process the power information, and can modulate a gain of the pre-amplifier 301 to reduce or eliminate opportunities for speaker damage. In some examples, the protection circuit 305 can include a multiplier 311 to multiply the received output voltage and current information to generate a representation of actual output power. In certain examples, the protection circuit can include an integrator circuit 312. The integrator circuit 312 can integrate the representation of actual output power to provide average output power information. In some examples, the integrator circuit 312 can compare the average power information with an average output power threshold ($V_{TH2}$) to generate a trim signal to modulate a gain of the pre-amplifier 301.

In certain examples, the speaker protection system can include a limiter 303. The limiter 303 can limit the output voltage swing of a signal, such as the output signal of the pre-amplifier 301, to limit the voltage swing of the output of the power amplifier 302. In certain examples, limits of the limiter 303 can be programmable. In certain examples, the speaker protection circuit can include a comparator 313, such as a hysteretic comparator, to compare the representation of the actual output power to a peak power threshold ($V_{TH1}$). In certain examples, an output of the comparator 313 can modulate one or more limits of the limiter 303 to reduce or eliminate opportunities for speaker damage due to excessive peak power.

In certain examples, the protection circuit 305 can include the power monitoring circuit and the power monitoring circuit can provide output power information including peak output power information and average output power information.

In an example, the protection circuit can receive temperature information of the speaker or speaker components, such as the pre-amplifier 301 or the power amplifier 302, and can modulate the gain of the pre-amplifier 301 or the limits of the limiter 303 to reduce or eliminate opportunities for speaker damage. In certain examples, the protection circuit can receive motion information of the speaker and can modulate the gain of the pre-amplifier 301 or limits of the limiter 303 to reduce or eliminate opportunities for speaker damage due to a blocked speaker port, for example. In certain example, one or more of the functions of the speaker protection circuit can be processed in a digital signal processor (DSP).

Certain examples of active speaker protection discussed above can improve a users listening experience of acoustic sounds, such as music and speech reproduction. Certain examples of active speaker protection discussed above can also reduce the number device returned by customers due to damaged audio speakers, even as the demand and accommodation of loader acoustic output from such devices progresses.

ADDITIONAL NOTES

In Example 1, an audio circuit can include a first amplifier configured to receive an input audio signal and to provide an amplified audio signal, a second amplifier configured to receive the amplified audio signal and to provide a drive signal to a speaker, a power monitoring circuit configured to provide peak power information and average power information of the drive signal, and a protection circuit configured to modulate a gain of the first amplifier using the average power information and a first threshold and to limit an amplitude of the amplified audio signal using the peak power information and a second threshold.

In Example 2, the audio circuit of claim 1 optionally includes a motion sensor configured to receive motion information about the speaker. The protection circuit can be configured to receive the motion information and to modulate the gain of the first amplifier in response to the received motion information.

In Example 3, the power monitoring circuit of any one or more of Examples 1-2 optionally is configured to receive the drive signal.

In Example 4, the power monitoring circuit of any one or more of Examples 1-3 optionally is configured to receive the amplified audio signal.

In Example 5, the power monitoring circuit of any one or more of Examples 1-4 optionally is configured to receive the input audio signal.

In Example 6, an audio transducer protection circuit can include a first comparator configured to compare peak power information of a drive signal of an amplifier of an audio system with a first threshold, a limiter circuit configured to limit an input of the amplifier if the peak power information of the drive signal exceeds the first threshold, and a second comparator configured to compare average power information of the drive signal with a second threshold and to provide an output signal configured to modulate a gain of a pre-amplifier of the audio system using the comparison.

In Example 7, the audio transducer protection circuit of any one or more of Examples 1-6 optionally includes a motion error detector configured to receive motion information of a speaker driven by the amplifier, to receive drive signal information from the amplifier, to provide motion error information using the motion information and the drive signal information, and to modulate a gain of the pre-amplifier or to limit the input of the amplifier in response to the motion error information.

In Example 8, the audio transducer protection circuit of any one or more of Examples 1-7 optionally includes a motion sensor configured to provide the motion information of the speaker.

In Example 9, the audio transducer protection circuit of any one or more of Examples 1-8 optionally includes a power monitoring circuit configured to receive the drive signal of the amplifier and to provide the peak power information and the average power information of the drive signal.

In Example 10, the audio transducer protection circuit of any one or more of Examples 1-9 optionally includes a power monitoring circuit configured to receive an output of the pre-amplifier and to provide the peak power information and the average power information of the drive signal.

In Example 11, the audio transducer protection circuit of any one or more of Examples 1-10 optionally includes a power monitoring circuit configured to receive an input of the pre-amplifier and to provide the peak power information and the average power information of the drive signal.

In Example 12, a method can include providing an amplified audio signal using a first amplifier and an input audio signal, providing a drive signal to a speaker using the amplified audio signal and a second amplifier, providing peak power information and average power information of the drive signal using a power monitoring circuit, modulating a gain of the first amplifier using the average power information and a first threshold, and limiting a voltage swing of the amplified signal using the peak power information and a second threshold.'

In Example 13, the method of any one or more of Examples 1-12 optionally includes receiving motion information from a motion sensor coupled to the speaker, and modulating the gain of the first amplifier in response to the received motion information.

In Example 14, the providing a representation of peak power and average power of the drive signal using a power monitoring circuit of any onme or more of examples 1-13 optionally includes providing a representation of peak power and average power of the drive signal using a power monitoring circuit and the amplified signal.

In Example 15, a mobile electronic system can include an audio transducer; and an audio circuit configured to drive the audio transducer. The audio circuit can include a first amplifier configured to receive an input audio signal and to provide an amplified audio signal, a second amplifier configured to receive the amplified audio signal and to provide a drive signal to the audio transducer, a power monitoring circuit configured to provide peak power information and average power information of the drive signal, and a protection circuit configured to modulate a gain of the first amplifier using the average power information and a first threshold and to limit an amplitude of the amplified audio signal using the peak power information and a second threshold. the audio circuit of any one or more of Examples 1-15 optionally includes a motion sensor configured to receive motion information about the audio transducer, wherein the protection circuit is configured to receive the motion information and to modulate the gain of the first amplifier in response to the received motion information.

In Example 17, the power monitoring circuit of any one or more of Examples 1-6 optionally is coupled to an output of the second amplifier.

In Example 18, the power monitoring circuit of any one or more of Examples 1-17 optionally is coupled to an output of the first amplifier.

In Example 19, the power monitoring circuit of any one or more of Examples 1-18 optionally is configured to receive the input audio signal.

In Example 20, the mobile electronic system of any one or more of Examples 1-19 optionally includes a wireless transceiver configured to communicate over a cellular network and to receive audio information for broadcast using the audio transducer.

In Example 21, a protection circuit of any one or more of Examples 1-20 optionally is configured to receive temperature information of at least one of a speaker, the first amplifier or the second amplifier, and to modulate at least one of a gain of the first amplifier or a limit of the limiter to reduce opportunities for speaker damage.

In Example 22, a protection circuit of any one or more of Examples 1-21 optionally includes one or more temperature sensors to provide the temperature information.

Example 23 can include, or can optionally be combined with any portion or combination of any portions of any one or more of Examples 1 through 22 to include, subject matter that can include means for performing any one or more of the functions of Examples 1 through 22, or a machine-readable medium including instructions that, when performed by a machine, cause the machine to perform any one or more of the functions of Examples 1 through 22.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An audio circuit comprising:
a first amplifier configured to receive an input audio signal and to provide an amplified audio signal;
a power amplifier configured to receive the amplified audio signal and to provide a drive signal to a speaker;
a power monitoring circuit coupled to an output of the power amplifier, the power monitoring circuit configured to provide peak power information and average power information of the drive signal; and
a protection circuit configured to modulate a gain of the first amplifier using the average power information and a first threshold and to limit an amplitude of the amplified audio signal using the peak power information and a second threshold.

2. The audio circuit of claim 1, including a motion sensor configured to receive motion information about the speaker; and
wherein the protection circuit is configured to receive the motion information and to modulate the gain of the first amplifier in response to the received motion information.

3. The audio circuit of claim 1, wherein the power monitoring circuit is configured to receive the drive signal.

4. The audio circuit of claim 1, wherein the power monitoring circuit is configured to receive the amplified audio signal.

5. The audio circuit of claim 1, wherein the power monitoring circuit is configured to receive the input audio signal.

6. An audio transducer protection circuit comprising:
a first comparator configured to compare peak power information of a drive signal of an amplifier of an audio system with a first threshold, the drive signal comprising an output of the amplifier;
a limiter circuit configured to limit an amplitude of an input of the amplifier if the peak power information of the drive signal exceeds the first threshold; and
a second comparator configured to compare average power information of the drive signal with a second threshold and to provide an output signal, the second comparator configured to modulate a gain of a pre-amplifier of the audio system using the comparison of the average power information of the drive signal with the second threshold to provide a pre-amplified audio signal to the amplifier through the limiter circuit.

7. The audio transducer protection circuit of claim 6, including a motion error detector configured to receive motion information of a speaker driven by the amplifier, to receive drive signal information from the amplifier, to provide motion error information using the motion information and the drive signal information, and to modulate the gain of the pre-amplifier or to limit the input of the amplifier in response to the motion error information.

8. The audio transducer protection circuit of claim 7, including a motion sensor configured to provide the motion information of the speaker.

9. The audio transducer protection circuit of claim 6, including a power monitoring circuit configured to receive the drive signal of the amplifier and to provide the peak power information and the average power information of the drive signal.

10. The audio transducer protection circuit of claim 6, including a power monitoring circuit configured to receive an output of the pre-amplifier and to provide the peak power information and the average power information of the drive signal.

11. The audio transducer protection circuit of claim 6, including a power monitoring circuit configured to receive an input of the pre-amplifier and to provide the peak power information and the average power information of the drive signal.

12. A method comprising:
providing an amplified audio signal using a first amplifier and an input audio signal;
providing a drive signal to a speaker using the amplified audio signal and a power amplifier;
providing peak power information and average power information of the drive signal using a power monitoring circuit;
modulating a gain of the first amplifier using the average power information and a first threshold; and
limiting a voltage swing of the amplified signal using the peak power information and a second threshold.

13. The method of claim 12, including:
receiving motion information from a motion sensor coupled to the speaker; and
modulating the gain of the first amplifier in response to the received motion information.

14. The method of claim 12, wherein the providing a representation of peak power and average power of the drive signal using a power monitoring circuit includes providing a representation of peak power and average power of the drive signal using a power monitoring circuit and the amplified signal.

15. A mobile electronic system comprising:
an audio transducer; and
an audio circuit configured to drive the audio transducer, the audio circuit including:
a first amplifier configured to receive an input audio signal and to provide an amplified audio signal;
a power amplifier configured to receive the amplified audio signal and to provide a drive signal to the audio transducer;
a power monitoring circuit configured to provide peak power information and average power information of the drive signal; and
a protection circuit configured to modulate a gain of the first amplifier using the average power information and a first threshold and to limit an amplitude of the amplified audio signal using the peak power information and a second threshold.

16. The mobile electronic system of claim 15, wherein the audio circuit includes a motion sensor configured to receive motion information about the audio transducer; and wherein the protection circuit is configured to receive the motion information and to modulate the gain of the first amplifier in response to the received motion information.

17. The mobile electronic system of claim 15, wherein the power monitoring circuit is coupled to an output of the power amplifier.

18. The mobile electronic system of claim 15, wherein the power monitoring circuit is coupled to an output of the first amplifier.

19. The mobile electronic system of claim 15, wherein the power monitoring circuit is configured to receive the input audio signal.

20. The mobile electronic system of claim 15, including a wireless transceiver configured to communicate over a cellular network and to receive audio information for broadcast using the audio transducer.

* * * * *